US007080990B1

(12) United States Patent
Juntwait et al.

(10) Patent No.: US 7,080,990 B1

(45) Date of Patent: Jul. 25, 2006

(54) CONTROL MODULE ASSEMBLY

(75) Inventors: Eric Juntwait, Hummelstown, PA (US); Chong Yi, Mechanicsburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/054,858

(22) Filed: Feb. 9, 2005

(51) Int. Cl.
*H01R 12/00* (2006.01)
*H05K 1/00* (2006.01)

(52) U.S. Cl. ........................................ 439/79; 439/76.1

(58) Field of Classification Search .................. 439/79, 439/46.1, 572, 892
See application file for complete search history.

(56) References Cited

U.S. PATENT DOCUMENTS 5,265,322 A * 11/1993 Fisher et al. .................. 29/848
5,591,050 A * 1/1997 Sueoka ........................ 439/607
5,593,319 A * 1/1997 Ohno .......................... 439/587
6,619,968 B1 * 9/2003 Xu .............................. 439/79
6,773,272 B1 * 8/2004 Koehler et al. ............... 439/79
6,866,552 B1 * 3/2005 Koehler ...................... 439/892
2003/0166348 A1 9/2003 Martin et al.

* cited by examiner

*Primary Examiner*—Hae Moon Hyeon
(74) *Attorney, Agent, or Firm*—Wei Te Chung

(57) ABSTRACT

A control module assembly (100) includes a module housing (1) defining a receiving cavity (14) therein having a front opening, a printed circuit board (3) adapted to be housed in the receiving cavity, a header connector (2) including a number of contacts (6) mounted on the printed circuit board and accessible from the front opening, and a front bezel (4) installed onto the header connector and attached to the module housing. The header connector includes interfaces adapted for mating with complementary connectors and interlocked with the opening. The header connector has sets of different passageways (503) accommodating the contacts and the front bezel includes shrouds (42) for sheltering the contacts therein so as to receive the complementary connectors.

14 Claims, 8 Drawing Sheets

CONTROL MODULE ASSEMBLY

BACKGROUND OF THE INVENTION

1. Field of the Invention

The present invention generally relates to a control module assembly, and more particularly to a control module assembly having a front bezel.

2. Description of Related Art

An existing control modules used for automotive or vehicular applications usually comprises a large header connector which are terminated to a printed circuit board (PCB). The header connector includes a plurality of terminals for insertion into appropriate holes in the PCB. The size of the connector will affect the size of the whole control module directly, so the large connector might take up a large area in a panel onto which the control module is fixed. With the ever-increasing density of the panel in electronic applications, space in the panel is very valuable, thereby leading to the ever-increasing miniaturization of electrical connectors.

U.S. Patent Publication No. 2003/0166348 A1 discloses an electrical connector therein. The electrical connector configured for connection to a substrate includes a housing that carries a plurality of electrical contacts and a contact guide. Each contact has a contact interface interconnectable with a reciprocal contact interface carried by the substrate. The contact guide has a plurality of apertures positioned to receive the contact interfaces of the contacts. By devising a single locking mechanism for securing both the contact guide and the substrate to the electrical connector, space on the electrical connector is thus saved.

However, in order to shelter a plurality of contacts with connecting portion exposed outside, it is still desired to provide a control module assembly having a front bezel.

SUMMARY OF THE INVENTION

Accordingly, a main object of the present invention is to provide a control module assembly which is reduced in size and having a front bezel for sheltering connecting portions of contacts therein.

In order to achieve the object set forth, a control module assembly in accordance with the present invention comprises a module housing defining a receiving cavity therein having a front opening, a printed circuit board adapted to be housed in the receiving cavity, a header connector including a plurality of contacts mounted on the printed circuit board and accessible from the front opening, and a front bezel installed onto the header connector and attached to the module housing. The header connector includes interfaces adapted for mating with complementary connectors and interlocked with the opening. The header connector has sets of different passageways accommodating the contacts and the front bezel includes shrouds for sheltering the contacts therein so as to receive the complementary connectors.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
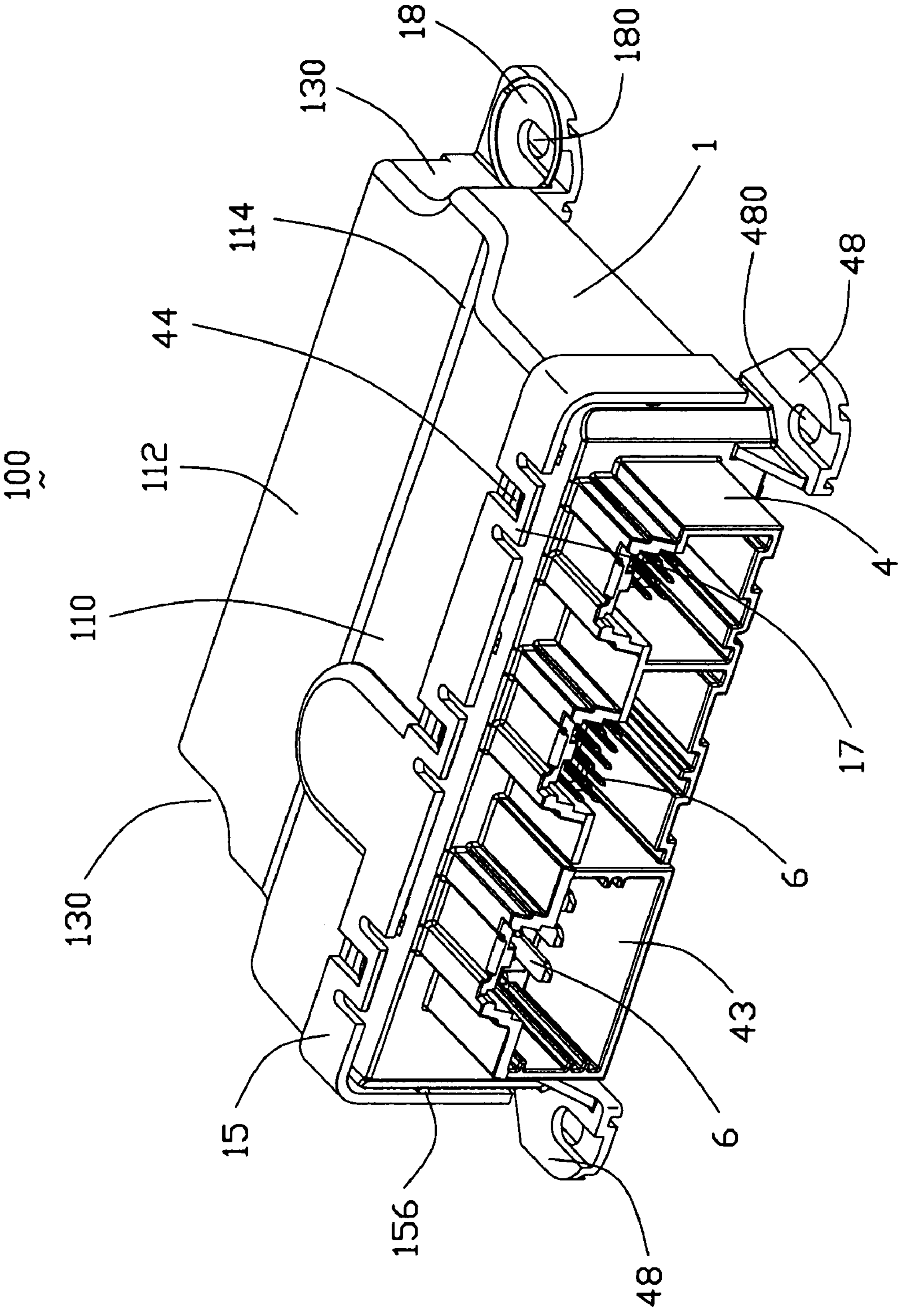
FIG. 1 is an assembled, perspective view of a control module assembly in accordance with the present invention.
Figure 2:
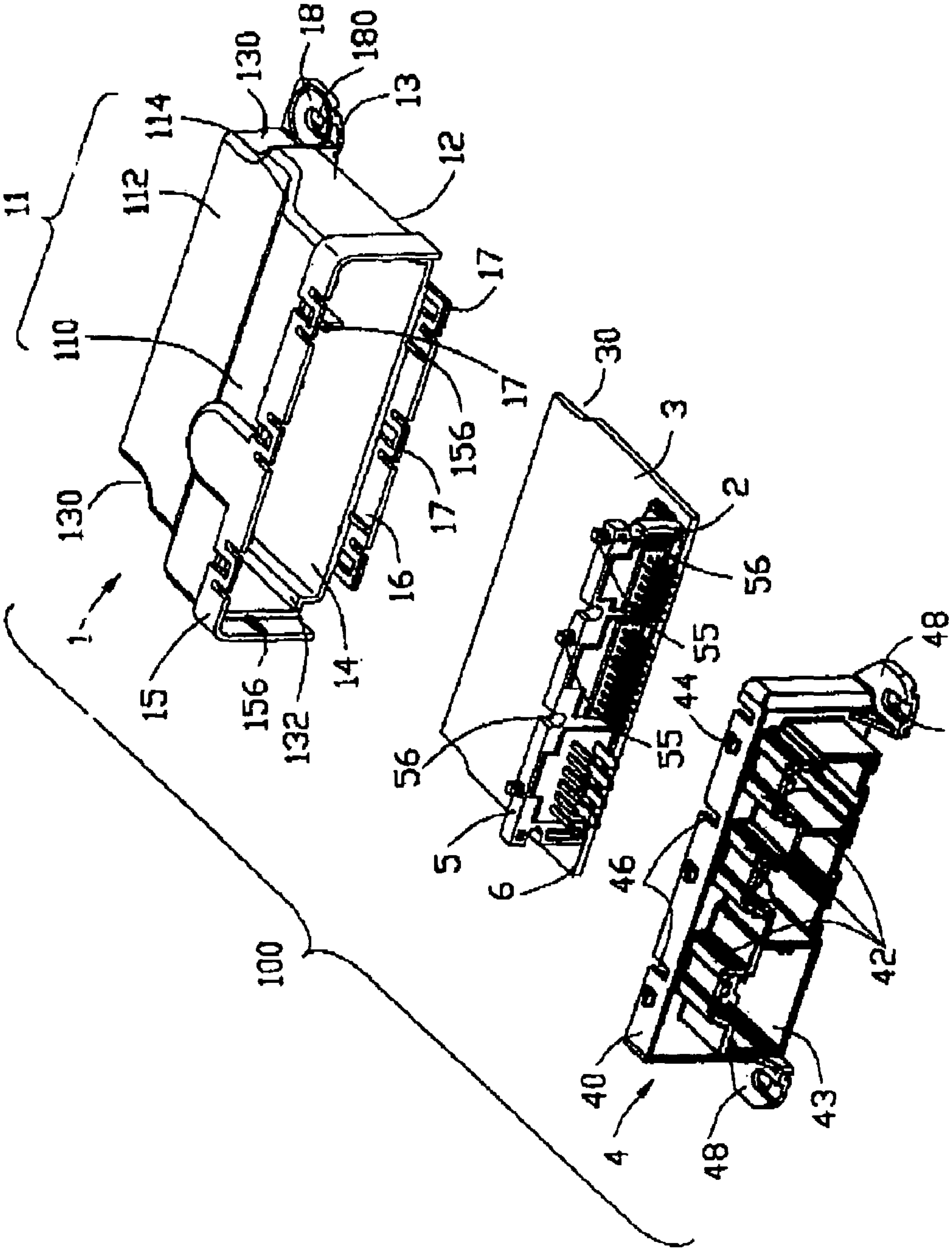
FIG. 2 is an exploded, perspective view of the control module assembly of FIG. 1.

Referring to FIGS. 1 and 2, a control module assembly 100 in accordance with the present invention comprises a module housing 1, a right angle header connector 2 retained in a first end edge of a printed circuit board (PCB) 3 and housed in the module housing, and a front bezel 4 connecting with the module housing 1 for sheltering a front end of the header connector 2.

Figure 3:
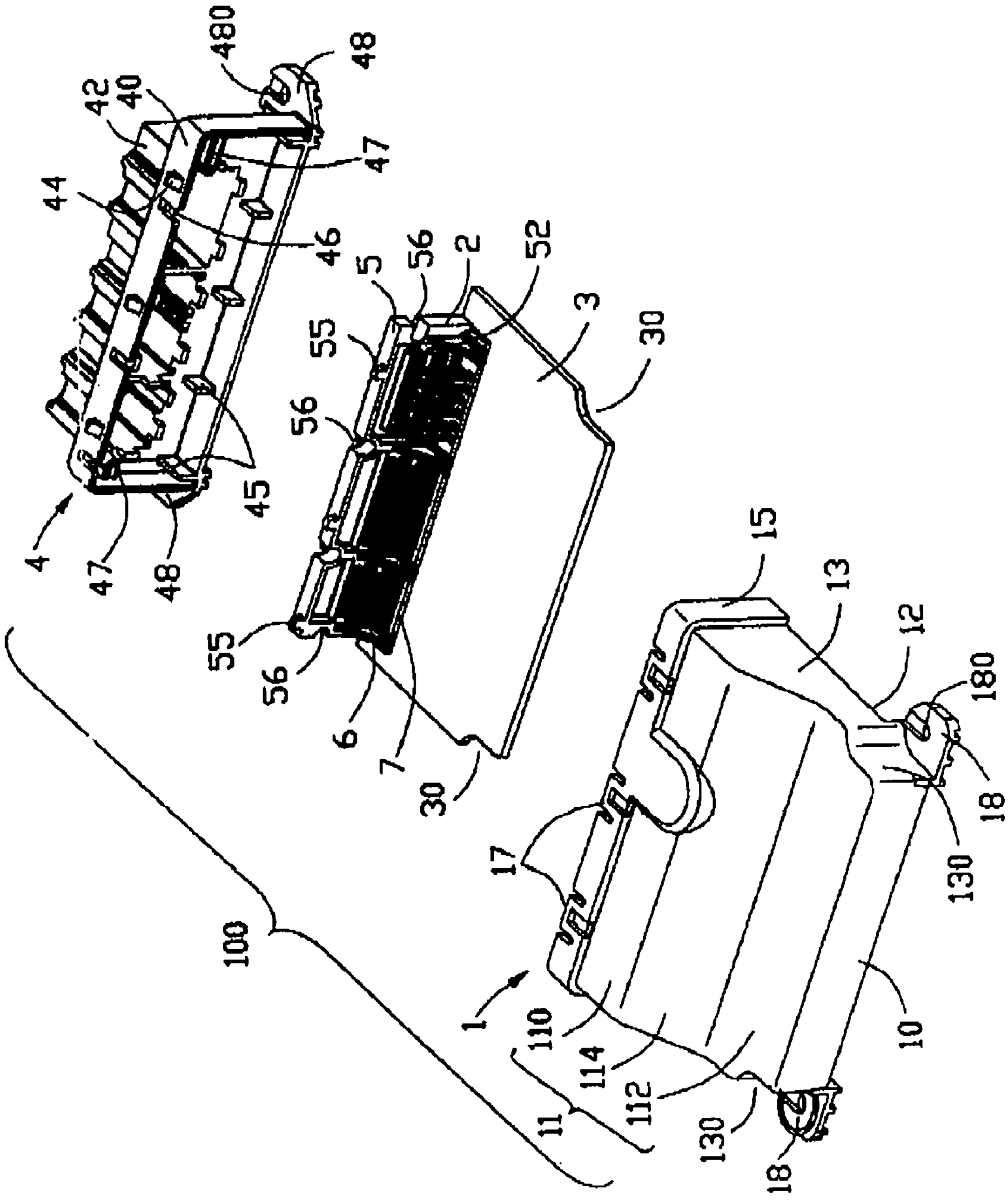
FIG. 3 is a view similar to FIG. 1, but taken from a rear aspect.
Figure 4:
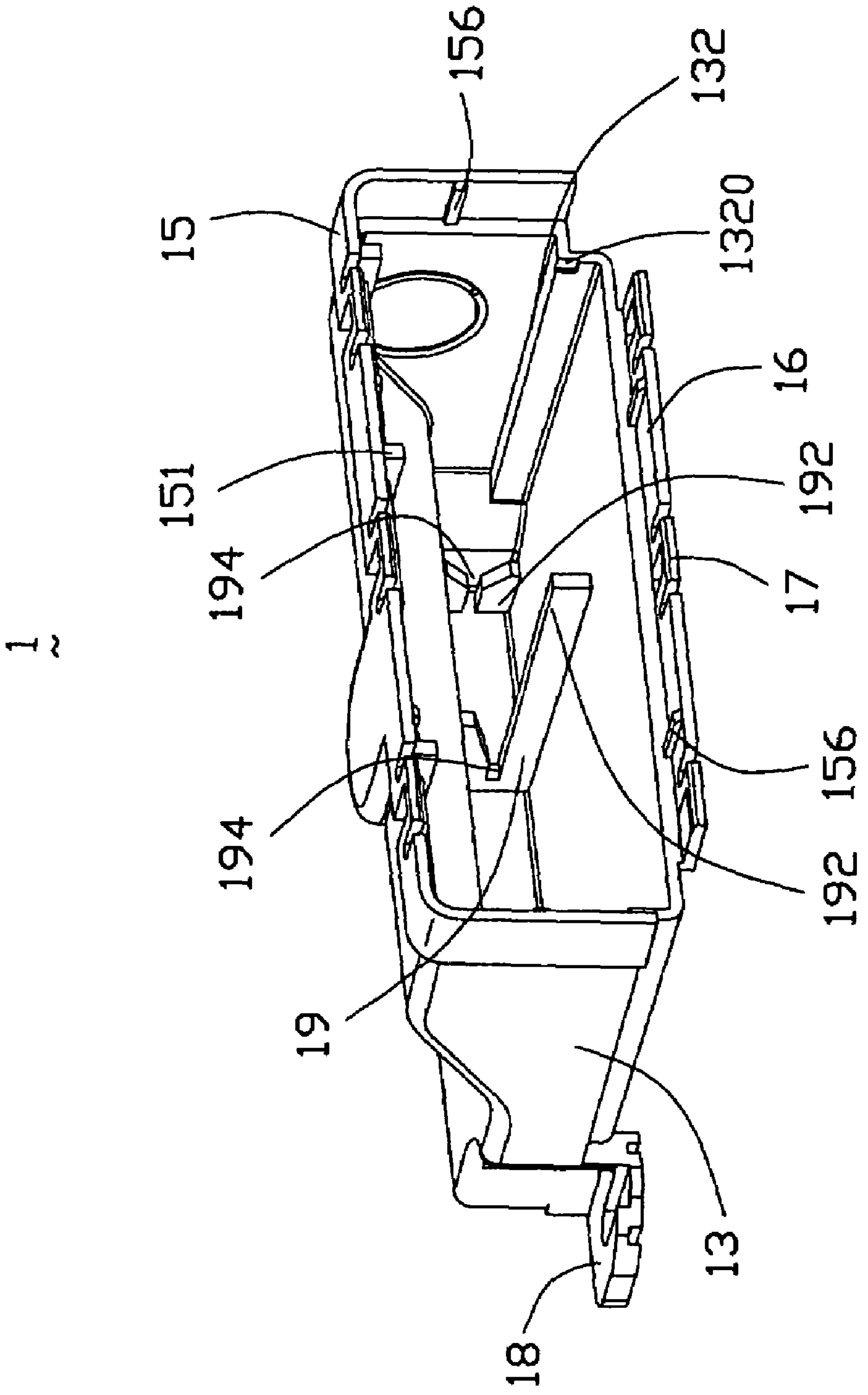
FIG. 4 is a perspective view of a module housing of FIG. 2, but taken from another aspect.

Referring to FIGS. 2–4, the module housing 1 is in the form of a approximately box-like structure and comprises a back wall 10, a top wall 11, a bottom wall 12 opposite to the top wall 11, and a pair of sidewalls 13 connecting with the top and the bottom walls 11, 12. The back wall 10 the top wall 11, the bottom wall 12 and the sidewalls 13 together define a receiving cavity 14 therebetween having a front opening (not labeled). The top wall 11 is step-shaped and forms a front portion 110, a rear portion 112 lower than the front portion, and a sloped portion 114 connecting with the front portion 110 and the rear portion 112. The module housing 1 includes a first connecting portion 15 extending forwardly from a front end thereof and connecting with the top wall 11 and the pair of sidewalls 13, and a second connecting portion 16 extending forwardly from the front end thereof and connecting with the bottom wall 12. A plurality of latches 17 are disposed in a horizontal portion of the first connecting portion 15 and the second connecting portion 16. Each sidewall 13 forms a inwardly depressed arc portion 130 in a rear thereof. The module housing 1 provides a pair of mounting flanges 18 disposed in the arc portions 130 of the sidewalls 13 and extending outwardly. Each mounting flange 18 defines a mounting hole 180 therein. Each sidewall 13 forms a shoulder 132 in an inner of a bottom portion thereof for supporting the PCB 3 and the shoulder 132 defines a indentation 1320 in a front end thereof. A plurality of vertical ribs 19 are disposed in the receiving cavity 14. Each vertical rib 19 has a supporting pillar 192 having a height equal to a height of the shoulder 132 for supporting the PCB 3 and a clamping slit 194 for clamping a end edge of the PCB 3 to prevent the PCB 3 from jumping upwardly. The top wall 11 and the horizontal portion of the first connecting portion 15 have a plurality of abutment ribs 151 in an inner thereof. A plurality of retention ribs 156 are disposed in inner surfaces of the first connecting portion 15 and the second connecting portion 16 for interferentially mating with a outer surface of the front bezel 4.

Figure 5:
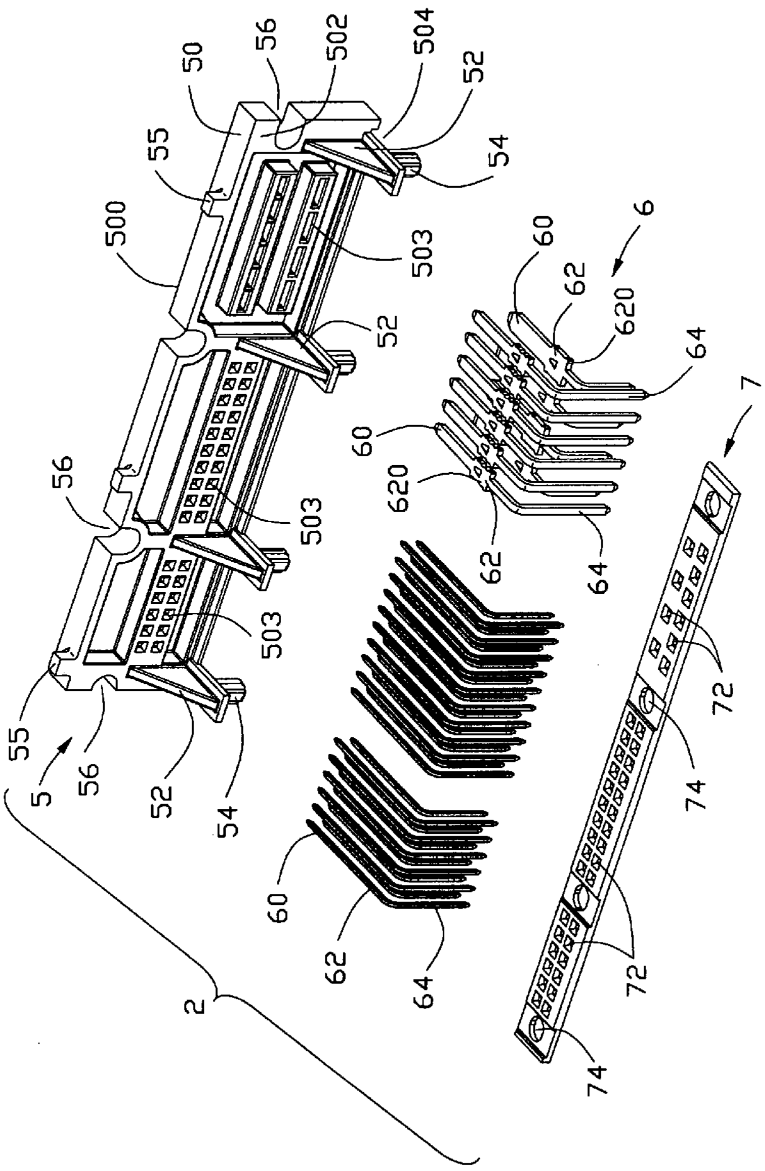
FIG. 5 is an exploded, perspective view of a header connector of FIG. 2, but taken from another aspect.
Figure 6:
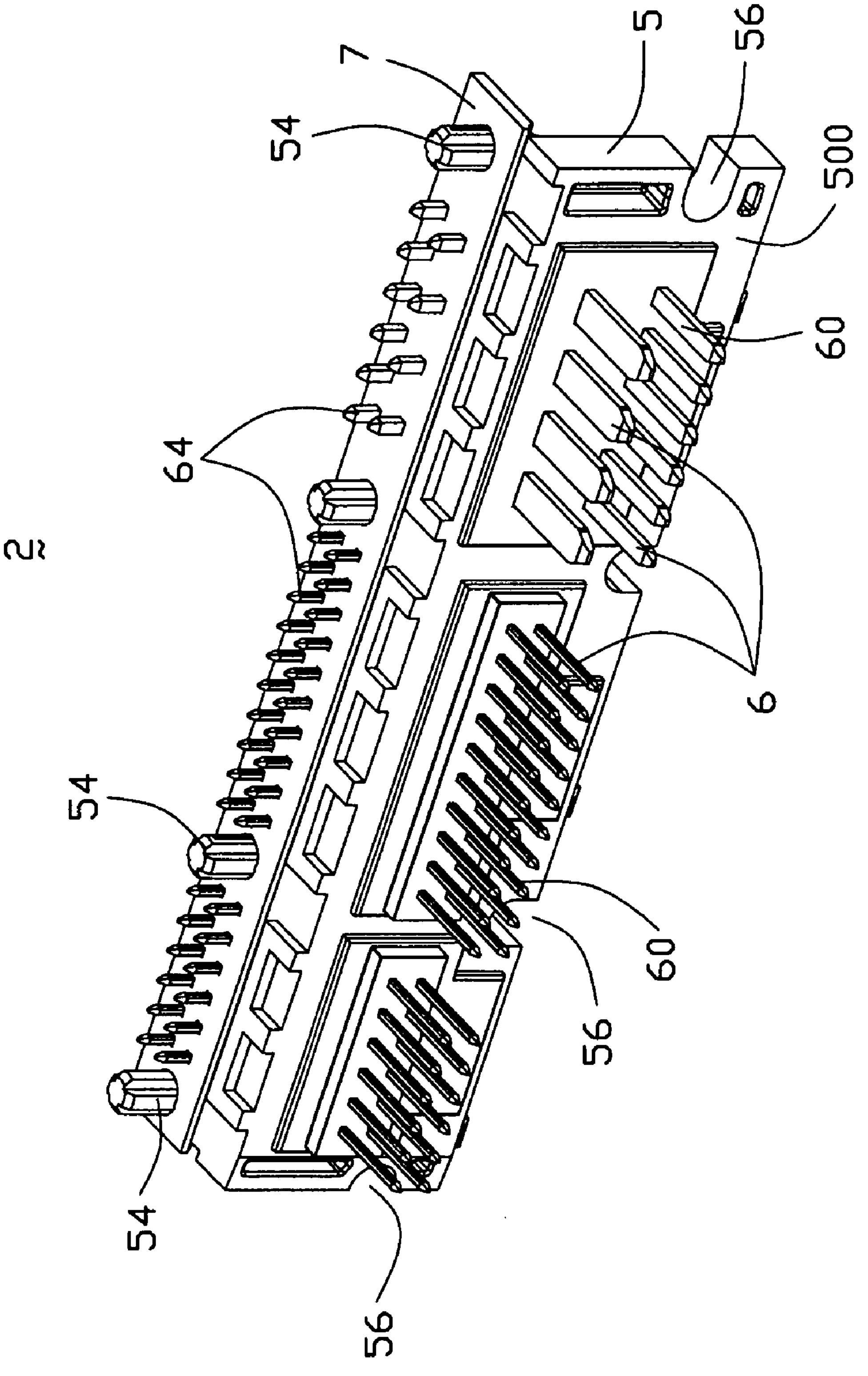
FIG. 6 is an assembled, perspective view of the header connector of FIG. 1.

Referring to FIGS. 5 and 6, the header connector 2 accessible from the front opening includes a header housing 5, a plurality of contacts 6 assembled to the header housing 5 in two rows and a contact organizer 7 attached to the header housing 5.

The header housing 5 includes an elongated base body 50 having a connection surface 500 and a back face 502 opposite to the connection surface 500. A pair of generally trapezoidal side wall portions 52 project rearward from right and left edge portions of the back face of the base body, and further, a pair of generally trapezoidal side wall portions 52 project rearward from a intermediate portion between the right and the left edge portions, thereby the base body being divided into three areas each defining a set of passageways 503 in upper and lower rows and extending through from the back face 502 to the connection surface 500. A attachment surface 504 of the base body 50 is constituted by a bottom surface of the base body 50 and bottom faces of the side wall portions 52. Each side wall portion 52 provides a cylindrical guiding post 54 extending downwardly from the attachment surface 504 for securing the header connector 2 to the PCB 3. The base body 50 has a plurality of abutment tabs 55 projecting upwardly from a top surface thereof for backing up against the abutment ribs to provide a support during mating with complementary harness connectors (not shown), and defines two pairs of cutouts 56 respectively in a top wall of adjacent two areas and opposite sidewalls thereof.

The contacts 6 are separated into three groups and each group is arranged in upper and lower rows. The three groups of contacts 6 are inserted into corresponding sets of passageways 503 of the base body 50 from the back face 502, thereby forming three different connector interfaces for mating with the complementary harness connectors. The contacts 6 include three types of contact having different transverse width for carrying different levels of current. Each contact 6 comprises a connecting portion 60 exposed to the connection surface 500, a retention portion 62 extending rearward from the connecting portion 60 and retained in respective passageway 503, and a tail portion 64 extending perpendicular to the connecting portion 60. Each retention portion 62 of the contact has barbs 620 in opposite side edge thereof.

The contact organizer 7 is plate-shaped and has a plurality of through apertures 72 for allowing the tail portions 64 of the contacts 6 to extend therethrough, and a plurality of circular guiding holes 74 aligning to corresponding guiding posts 54. The guiding posts 54 are sized and shaped to form an interference fit with corresponding guiding holes 74 in the contact organizer 7 so that the contact organizer 7 can be press fitted onto the guiding posts 54.

Referring to FIGS. 2 and 3, the PCB 3 defines a pair of notches 30 in opposite sides of a second end edge thereof for eliminating interference with the module housing 1.

Figure 7:
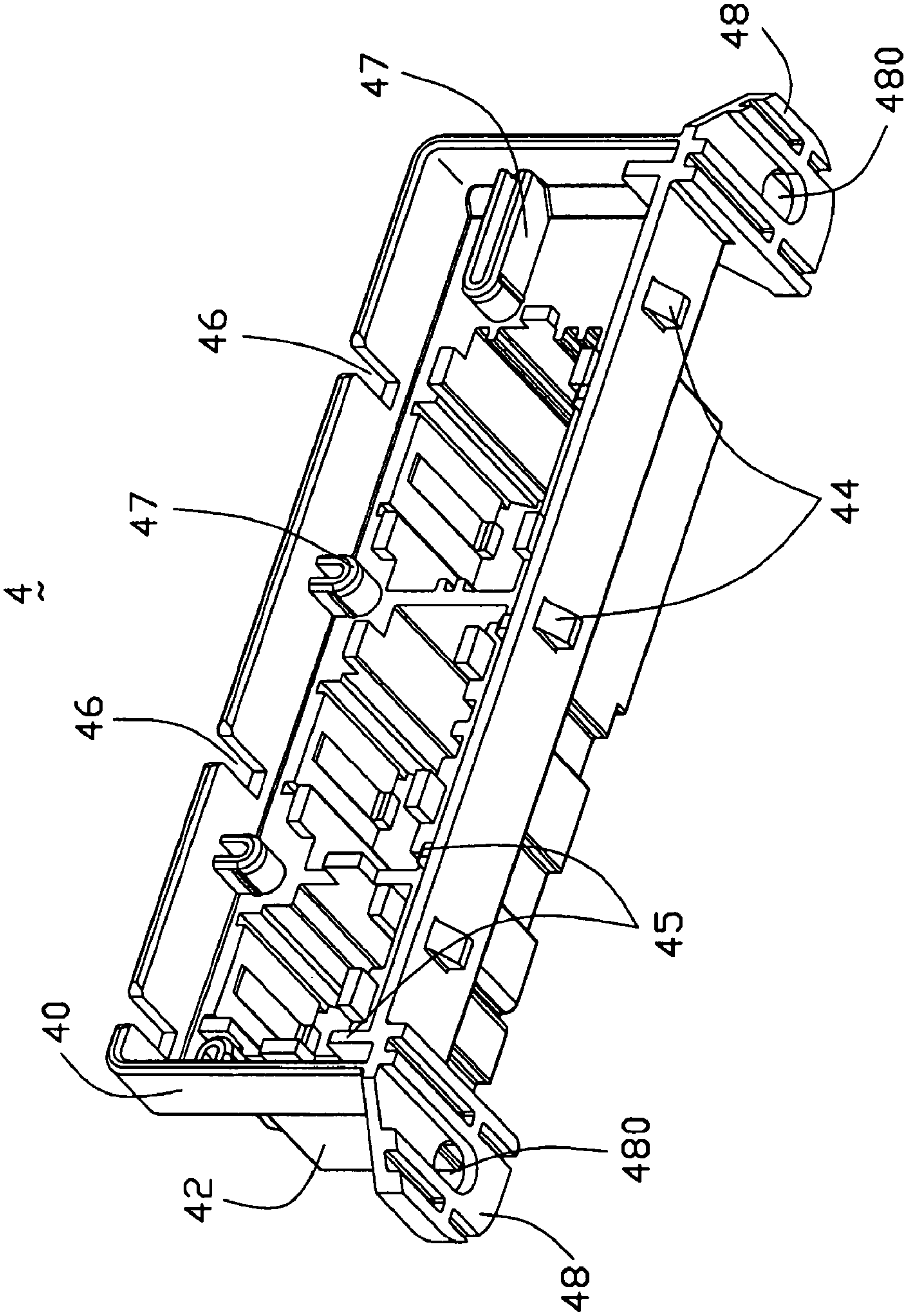
FIG. 7 is a perspective view of a front bezel of FIG. 6.

Referring to FIGS. 2, 3 and 7, the front bezel 4 comprises a rectangular hollow connecting frame 40 and three integrated connector shrouds 42 projecting forwardly from the connecting frame 40 and corresponding to the three connector interfaces of the header connector 2. Each connector shroud 42 defines a through receptacle 43 for receiving the mating harness connector. The connecting frame 40 includes a plurality of wedge-shaped latching bosses 44 projecting from top and bottom surfaces thereof and a plurality of supporting pillars 45 disposed in an inner of a bottom wall thereof, and defines a plurality of slots 46 in a rear of a top wall thereof. The connecting frame 40 provides a plurality of crush ribs 47 in an inner of the rear thereof corresponding to the cutouts of the header housing 5. A pair of mounting flanges 48 are disposed in opposite ends of the connecting frame 40 for providing a support to the front bezel 4 for strain relief and each mounting flange 48 defines a mounting hole 480 therein. The crush ribs 47 are sized and shaped to form an interference fit with corresponding cutouts in the header housing 5 so that the front bezel 4 can be press fit onto the header connector 2.

Figure 8:
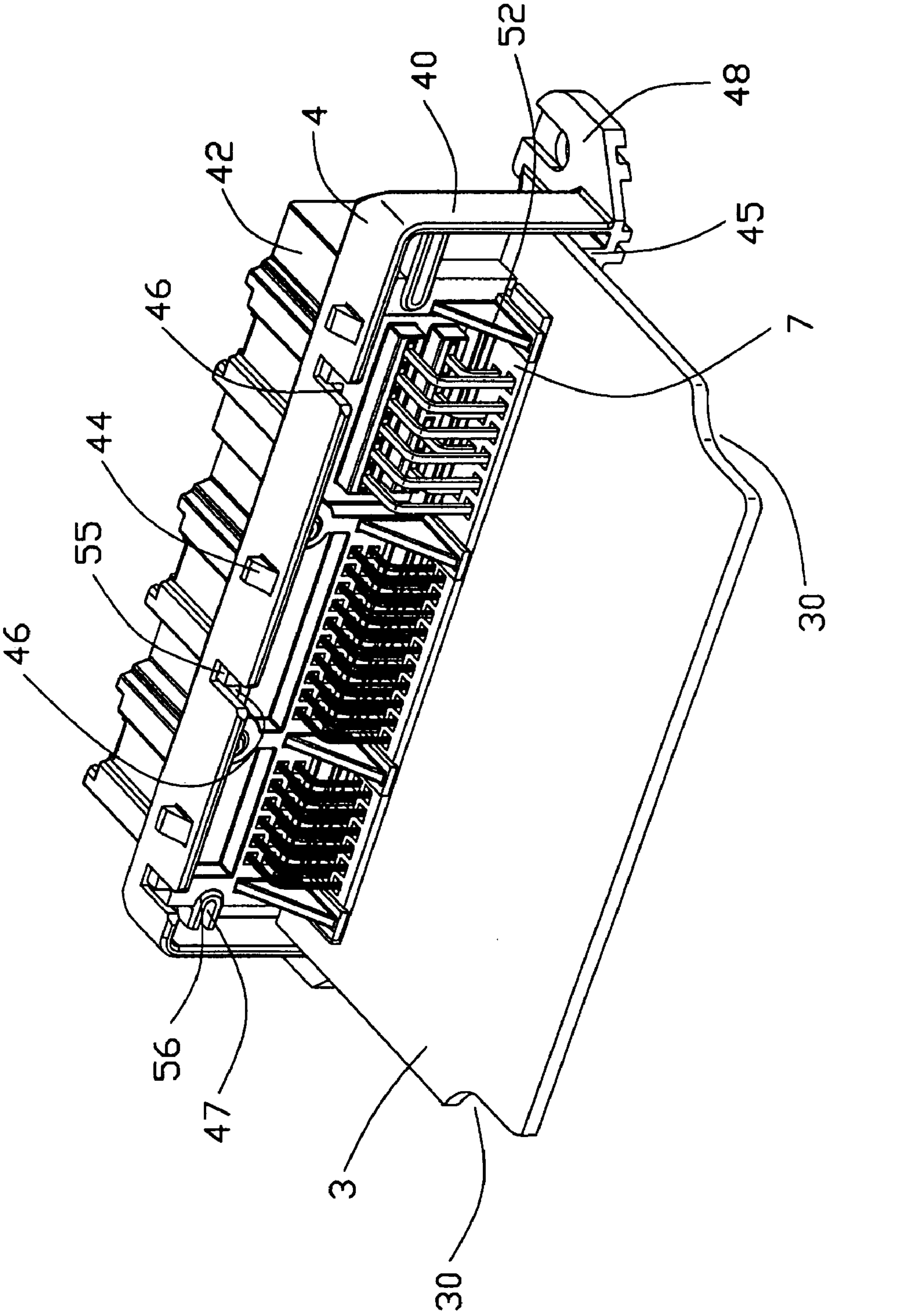
FIG. 8 is an assembled, perspective view of the control module assembly with the module housing being removed to facilitate the illustration.

Referring to FIGS. 1, 2 and 8, in assembly, the front bezel 4 is installed onto the header connector 2 with the PCB 3, with the abutment tabs 55 of the header housing 5 engaging with the slots 46 of the front bezel 4 and the crush ribs 47 of the front bezel 4 being press fitted in the cutouts of the header housing 5. The first end edge of the PCB is supported by the supporting pillars 45 of the front bezel. Then, the header connector with the PCB and the front bezel is housed in the module housing with the latching bosses 44 of the front bezel 4 latching with the latches 17 of the module housing 1. The PCB is rested on the shoulder 132 of the module housing 1 and sandwiched in the clamping slits 194 of the vertical ribs. The control module assembly 100 in accordance with the present invention is thus formed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A control module assembly comprising:

a module housing defining a receiving cavity therein having a front opening;

a printed circuit board adapted to be housed in said receiving cavity; and a header connector including a plurality of contacts mounted on the printed circuit board and accessible from the front opening, the header connector including interfaces adapted for mating with complementary connectors and interlocked with the opening, and having sets of different passageways accommodating the contacts so as to receive the complementary connectors a front bezel installed onto the header connector and attached to the module housing, wherein the front bezel includes shrouds for sheltering the contacts received in sets of passageways to form said interfaces; and wherein the header connector has a plurality of abutment tabs projecting upwardly from a top surface thereof and the front bezel defines a plurality of slots in a rear of a top wall thereof for engaging with said abutment tabs.

2. The control module assembly as claimed in claim 1, wherein the module housing has a plurality of abutment ribs in an inner of a top wall thereof for backing up against said abutment tabs.

3. The control module assembly as claimed in claim 2, wherein the front bezel provides a plurality of latching bosses projecting from top and bottom surfaces thereof and the module housing has a plurality of latches for latching with corresponding latching bosses.

4. The control module assembly as claimed in claim 3, wherein the module housing provides a pair of shoulders in opposite sides of a bottom portion thereof for supporting the printed circuit board.

5. The control module assembly as claimed in claim 4, wherein the module housing and the front bezel have a plurality of supporting pillars each having a height equal to a height of the shoulder.

6. The control module assembly as claimed in claim 5, wherein the module housing and the front bezel each include a pair of mounting flanges each having a mounting hole therein.

7. The control module assembly as claimed in claim 1, wherein said header connector comprises a header housing and a contact organizer attached to the header housing and wherein the contact organizer defining a plurality of through apertures for allowing tail portions of the contacts to extend therethrough.

8. The control module assembly as claimed in claim 7, wherein said header housing includes a plurality of guiding posts in an attachment surface thereof and the contact organizer defining corresponding guiding holes for interferentially fitting with the guiding posts.

9. The control module assembly as claimed in claim 8, wherein the header housing includes a plurality of side wall portions projecting rearward from a back face thereof to separate said sets of passageways and the guiding posts are disposed in the side wall portions.

10. A control module assembly comprising:

a printed circuit board;

a header connector mounted to a front edge region of the printed circuit board, and including a header housing and a plurality of contacts disposed in the housing;

the header housing including a plurality of sections with corresponding contacts therein, respectively;

a module housing defining a cavity receiving said printed circuit board therein;

a unitary front bezel attached onto and positioned in a front portion of the module housing and defining a plurality of openings isolated from one another and respectively aligned with the corresponding sections in a front-to-back direction, and enclosing the corresponding contacts therein.

11. The control module assembly as claimed in claim 10, wherein said front bezel further includes a pair of support flanges.

12. The control module assembly as claimed in claim 10, wherein said module housing further includes a pair of support flanges.

13. The control module assembly as claimed in claim 10, wherein said front bezel is fastened to the module housing.

14. The control module assembly as claimed in claim 10, wherein said header housing is of a unitary piece.

* * * * *